(12) United States Patent
Bal et al.

(10) Patent No.: US 11,933,861 B2
(45) Date of Patent: Mar. 19, 2024

(54) PHASE-INDEPENDENT TESTING OF A CONVERTER

(71) Applicant: STMicroelectronics International N.V., Geneva (CH)

(72) Inventors: Ankur Bal, Greater Noida (IN); Sharad Gupta, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/860,959

(22) Filed: Jul. 8, 2022

(65) Prior Publication Data

US 2023/0024278 A1 Jan. 26, 2023

Related U.S. Application Data

(60) Provisional application No. 63/221,333, filed on Jul. 13, 2021.

(51) Int. Cl.
*G01R 31/40* (2020.01)

(52) U.S. Cl.
CPC .................... *G01R 31/40* (2013.01)

(58) Field of Classification Search
CPC .. G01R 31/40; G01R 31/2879; H03M 1/1095
USPC .................... 324/764.01, 537, 500
See application file for complete search history.

(56) References Cited

U.S. PATENT DOCUMENTS

| | | | |
|---|---|---|---|
| 7,250,882 B2 | 7/2007 | Goyal et al. | |
| 8,386,209 B2 | 2/2013 | Mullane et al. | |
| 8,855,215 B2 | 10/2014 | Roberts et al. | |
| 9,342,482 B2 | 5/2016 | Park et al. | |
| 10,094,874 B1* | 10/2018 | Tangyunyong | G01R 31/2879 |
| 11,187,745 B2* | 11/2021 | Messier | G01R 31/31924 |
| 2006/0122814 A1 | 6/2006 | Beens et al. | |
| 2015/0185278 A1* | 7/2015 | Su | H04L 1/243 |
| | | | 324/750.03 |
| 2020/0341052 A1* | 10/2020 | Barthel | G01R 13/0218 |
| 2021/0126748 A1* | 4/2021 | Osmanovic | H04L 1/244 |
| 2021/0199710 A1* | 7/2021 | He | G01R 31/2879 |

OTHER PUBLICATIONS

Barragan et al., "A Fully-Digital BIST Wrapper Based on Ternary Test Stimuli for the Dynamic Test of a 40 nm CMOS 18-bit Stereo Audio ΣΔADC," *IEEE Transactions on Circuits and Systems—i: Regular Papers* vol. 63, No. 11, 2016. (13 pages).
Huang et al., "A BIST Scheme for On-Chip ADC and DAC Testing," *Proceedings Design, Automation & Test in Europe Conference & Exhibition*, Pans, France, Mar. 27-30, 2000. (6 pages).

* cited by examiner

*Primary Examiner* — Giovanni Astacio-Oquendo
(74) *Attorney, Agent, or Firm* — Seed IP Law Group LLP

(57) ABSTRACT

A method and apparatus for performing an on-system built-in self-test of a converter are provided. In the method, a controller generates a test signal and outputs the test signal to the converter. The controller receives a response signal from the converter and determines a plurality of bin powers of a plurality of bins, respectively, of a frequency domain signal representative of the response signal. The controller determines a figure of merit for the converter based on a first bin power of a first bin of the plurality of bin powers, where the first bin corresponds to a frequency of the test signal.

20 Claims, 6 Drawing Sheets

PHASE-INDEPENDENT TESTING OF A CONVERTER

BACKGROUND

Technical Field

The present application is directed to phase-independent testing of a converter, and, in particular, testing the converter using an on-system built-in self-test.

Description of the Related Art

Mixed-signal intellectual property (IP) core systems are typically tested using functional specification testing. However, use of specialized testing equipment to test a system may become impractical in a complex system. External access to internal cores can be difficult. Furthermore, testing a mixed-signal IP core can increase the overall manufacturing cost. Accordingly, it is desirable to have a lower cost alternative to using specialized testing equipment.

BRIEF SUMMARY

A built-in self-test for a device under test, such as a modulator or converter, is provided. The built-in self-test may be carried out by an on-chip controller without use of external test equipment. The built-in self-test determines a figure of merit for the device under test, such as a signal-to-noise ratio (SNR). The built-in self-test sends a stimulus signal to the device under test. The device under test generates a response signal to the stimulus signal.

In performing the test, the controller determines bin powers of a frequency domain signal representative of the response signal. The controller then determines the figure of merit based on the bin powers. For example, the controller may determine the SNR as a ratio between a signal power and a noise power. The signal power may be a power of a bin corresponding to a frequency of the stimulus signal. The noise power is a sum of the bin powers of the remaining bins other than the bin corresponding to the frequency of the stimulus signal.

DETAILED DESCRIPTION

Figure 1:
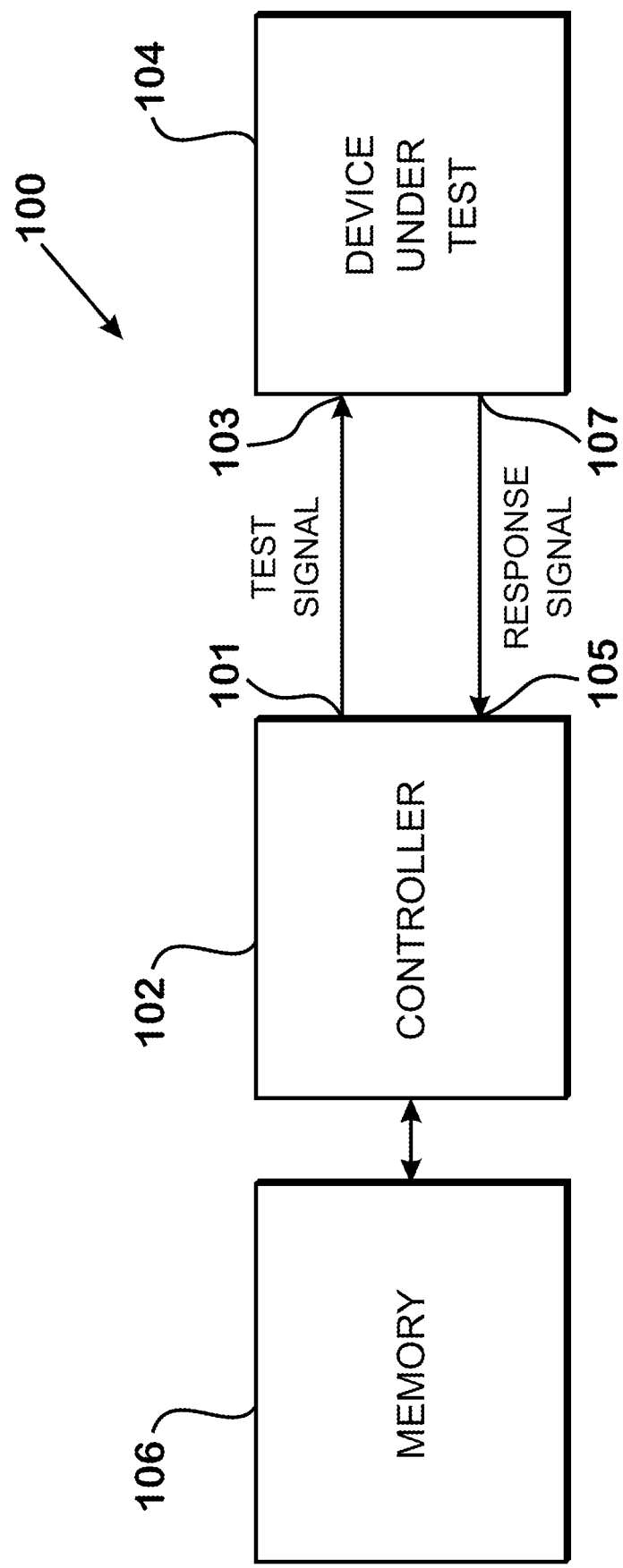
FIG. 1 shows a built-in self-test (BIST) system.

FIG. 1 shows a built-in self-test system 100. The built-in self-test system 100 includes a controller 102, a device under test (DUT) 104 and memory 106. The controller 102 is communicably coupled to the device under test 104 and the memory 106. The built-in self-test system 100 may be a system-on-chip (SOC) or may be part of the SOC. The built-in self-test system 100 may include mixed-signal IP cores in which access to a core is restricted. For example, access to the device under test 104 may be restricted by a designer of the core. The controller 102 or another device of the system 100 may be configured with a built-in test and may perform the test (as an on-system test) on the device under test 104 thereby forgoing a dedicated external test.

The device under test 104 may be a modulator or a converter, such as a continuous-time delta-sigma analog-to-digital converter (ADC), among others. The device under test 104 may receive a first signal that is a continuous-time analog signal and output a second signal that is a digital representative of the first signal. The built-in self-test may determine a figure of merit for the device under test 104. The figure of merit may represent or reflect the performance of the device under test 104 in response to a stimulus. The figure of merit may be a signal-to-noise ratio (SNR) or a total harmonic distortion of the device under test 104. Testing the device under test 104 or determining a figure of merit of the device under test 104 may include determining a spectrum for the device under test 104, performing tone detection to determine a dominant or maximum input bin or performing spectral analysis on the device under test 104.

The memory 106 may be any data storage device. The memory 106 may store executable instructions that, when executed by the controller 102, cause the controller 102 to operate as described herein. The memory 106 may be read-only memory (ROM) or random access memory (RAM), among others. In addition to executable instructions, the memory 106 may store data. The data may include results of tests performed on the device under test 104.

The controller 102 may be any device configured to test the device under test 104. The controller 102 may be a processor, a microprocessor or a microcontroller. The controller 102 may include a central processing unit (GPU) or a graphics processing unit (GPU), among others. The controller 102 may utilize the computational capability to perform the built-in self-test. The controller 102 may access the memory 106 and retrieve and execute the executable instructions stored thereon. The controller 102 may generate and send a test signal to the device under test 104. In response to sending the test signal, the controller 102 may receive a response signal from the device under test 104. The controller 102 may evaluate the response signal. The controller 102 may determine a figure of merit for the device under test 104 based on the response signal. For example, the controller 102 may determine a signal-to-noise ratio (SNR) for the device under test 104, a harmonic distortion or another signal quality indicator.

Figure 2:
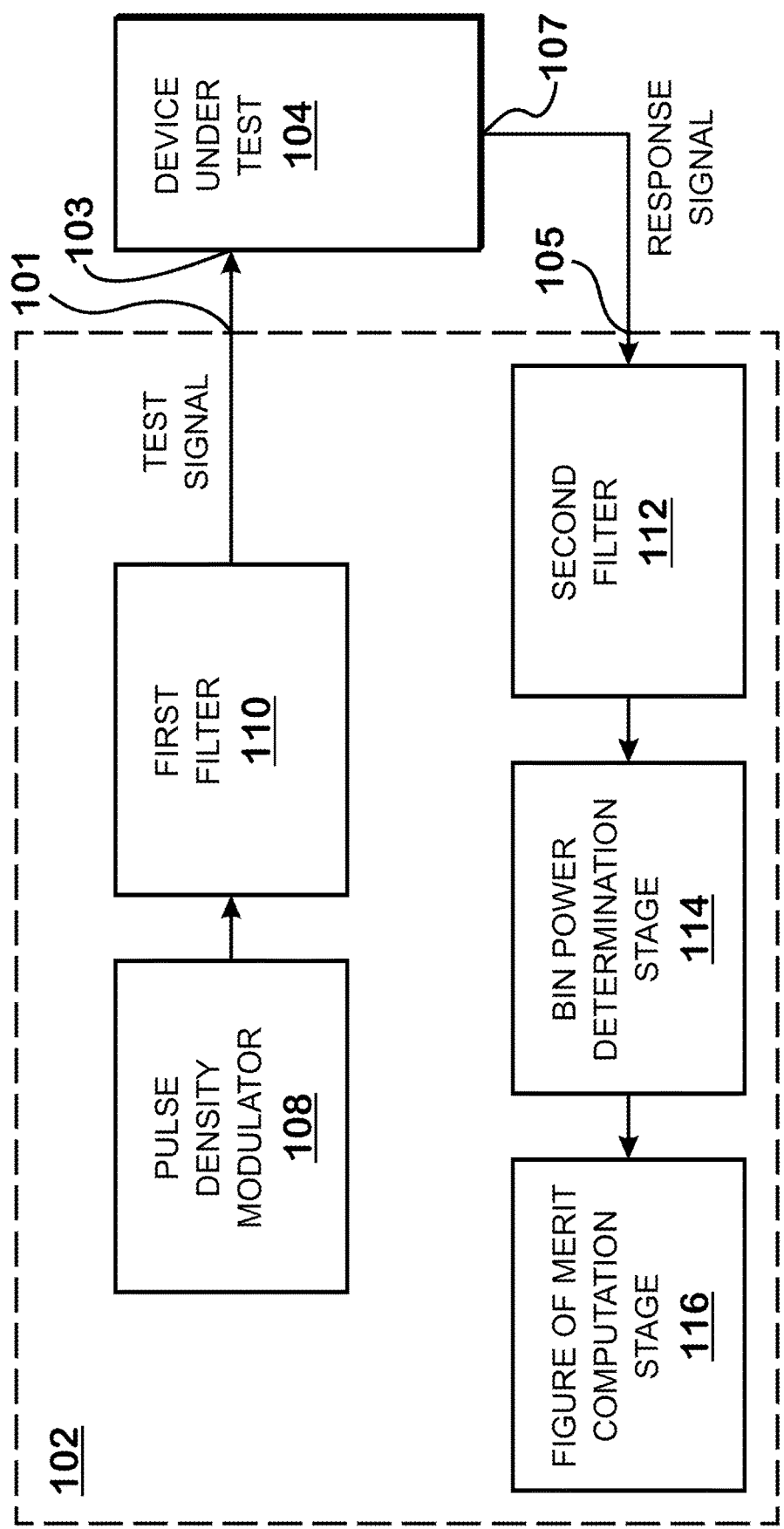
FIG. 2 shows a functional block diagram of the controller.

FIG. 2 shows a functional block diagram of the controller 102. The controller 102 includes a pulse density modulator 108, a first filter 110, a second filter 112, a bin power determination stage 114 and a figure of merit computation stage 116. The controller 102 has an output 101 coupled to an input 103 of the device under test 104. The controller 102 has an input 105 coupled to an output 107 of the device under test 104. The pulse density modulator 108, which may be the one-bit ROM, generates a signal. The signal may be a sinusoid, among others, having a frequency. The pulse density modulator 108 outputs the signal to the first filter 110. The first filter 110 may be a finite impulse response (FIR) digital-to-analog converter (DAC). The first filter 110 may be a low-pass filter. The first filter 110 filters and smoothens the signal and outputs the test signal to the device under test 104. The test signal may be an analog signal (e.g., sinusoid).

The device under test 104 receives the test signal. The device under test 104 generates the response signal based on the test signal. For example, when the device under test 104 is a continuous-time delta-sigma analog-to-digital converter, the response signal may be a digital signal or a discrete signal representative of the analog test signal and having underdone digitization by the device under test 104. The device under test 104 outputs the response signal to the controller 102. The response signal may have a phase shift in relation to the test signal. As described herein, the test is phase-agnostic, whereby the phase shift of the response signal due to operation of the device under test 104 may not be known and does not materially impact the test. The second filter 112 of the controller 102 receives the response signal and filters the response signal to generate a filtered signal. The second filter 112 may reduce the rate of the response signal.

The bin power determination stage 114 performs a discrete Fourier transform (DFT) on the filtered signal to generate a frequency domain signal. The bin power determination stage 114 determines a bin power of bins of the frequency domain signal and outputs the bin power to the figure of merit computation stage 116. The figure of merit computation stage 116 determines a figure of merit (for example, an SNR or another signal quality metric) based on the bin power. The figure of merit may represent the response of the device under test 104 to a stimulus.

Figure 3:
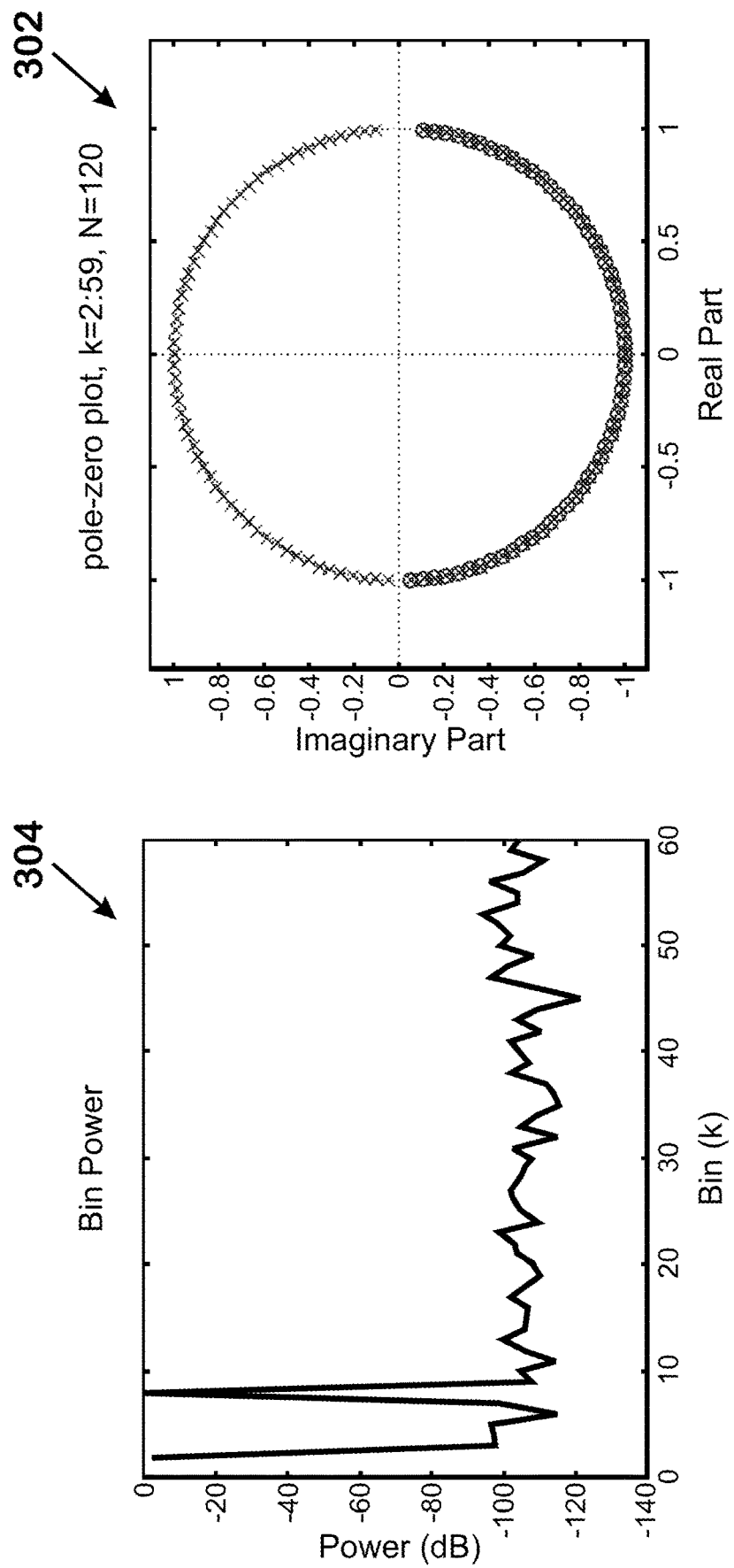
FIG. 3 shows an example of segmenting a frequency domain signal into a plurality of bins.

FIG. 3 shows an example of segmenting the frequency domain signal into a plurality of bins. A pole-zero plot 302 shows the frequency domain divided into the plurality of bins (N). Bin k=N/2 corresponds to the Nyquist frequency. A bin power plot 304 shows the power of the filtered signal in each bin. As shown in the pole-zero plot 302, the bandwidth corresponds to bin N/2 and each bin k=1, 2, ..., N/2 corresponds to a segment of the frequency domain. The signal power is observed at bin k=8. In addition, the bin power plot 304 exhibits a direct current (DC) component at k=2.

The discrete Fourier transform of the filtered signal is represented in continuous time by the Goertzel algorithm as:

$$H(z) = \frac{1 - e^{-j2\pi k/N} z^{-1}}{1 - 2\cos(2\pi k/N) z^{-1} + z^{-2}}. \quad \text{Equation (1)}$$

Figure 4:
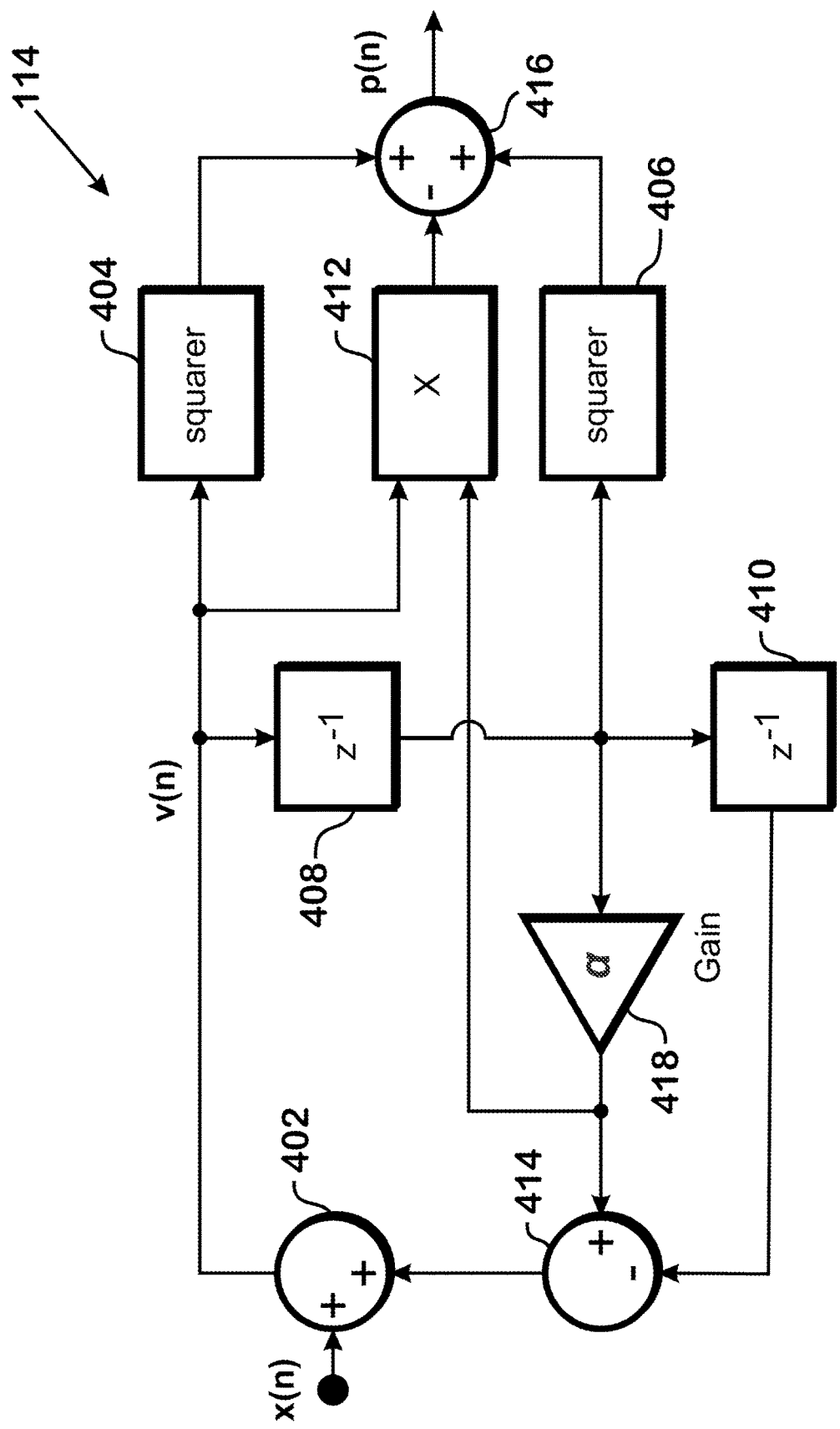
FIG. 4 shows a functional block diagram of discrete time bin power determination by a bin power determination stage.

FIG. 4 shows a functional block diagram of discrete time bin power determination by the bin power determination stage 114. The bin power determination stage 114 includes an adder 402, first and second squarers 404, 406, first and second delay elements 408, 410, a multiplier 412, a subtractor 414, an aggregator 416 and a gain element 418. The bin power determination stage 114 may sequentially or iteratively determine the bin power for a plurality of bins of the frequency domain signal. The plurality of bins may span the entire bandwidth of the frequency domain signal (reach k=N/2). The plurality of bins may, alternatively, spans a bandwidth of interest that is narrower than the bandwidth of the frequency domain signal.

The controller obtains the filtered signal (x(n)) and stores the filtered signal (x(n)) for processing by the bin power determination stage 114 as described herein. The adder 402 receives the filtered signal (x(n)) and an output signal of the subtractor 414. The adder 402 adds the filtered signal (x(n)) and the output signal of the subtractor 414 and produces an intermediary signal (v(n)). The intermediary signal for bin k is represented as:

$$v_k(n) = x(n) + \alpha v_k(n-1) - v_k(n-2), \quad \text{Equation (2)}$$

where $$\alpha = 2\cos\left(\frac{2\pi k}{N}\right)$$

and n is the time index.

The intermediary signal ($v_k(n)$) is delayed by the first and second delay elements 408, 410 and provided to a negating input of the subtractor 414 for determining the intermediary signal of subsequent time indices. The intermediary signal ($v_k(n)$) is also delayed by the first delay element 408 and multiplied, using the gain element 418, by a gain of α, and the resulting signal is provided to a non-negating input of the subtractor 414. The subtractor 414 subtracts the signal received at the negating input from the signal received at the non-negating input to produce the output signal to the adder 402.

The first squarer 404 squares the intermediary signal ($v_k(n)$) and outputs a squared intermediary signal ($v_k(n)^2$). The second squarer 406 squares the time-delayed intermediary signal ($v_k(n-1)$) having undergone time delay by the first delay element 408 and outputs a squared time-delayed intermediary signal ($v_k(n-1)^2$). The multiplier 412 multiplies the intermediary signal ($v_k(n)$) with the output of the gain element 418 ($\alpha v_k(n-1)$).

The aggregator 416 adds the outputs of the squarers 404, 406 and subtracts therefrom the output of the gain element 418. The output of the aggregator 416 is the bin power in the bin k:

$$p_k(n) = v_k(n)^2 + v_k(n-1)^2 - 2v_k(n)v_k(n-1)\cos\left(\frac{2\pi k}{N}\right). \quad \text{Equation (3)}$$

The bin power determination stage 114 may determine the power ($p_k(n)$) of each bin k for the entire available bandwidth (k=1, 2, ..., N/2). The bin power determination stage 114 may determine the power ($p_k(n)$) of bins in a band of interest. For example, if k=N/2 corresponds to 100 megahertz (MHz) and the band of interest only reaches 20 MHz (a fifth of the entire available bandwidth), the bin power determination stage 114 may determine the power ($p_k(n)$) of each bin k in a limited range, where k=1, 2, ..., N/10.

Following determining the power of each frequency bin, the figure of merit determination stage 116 determines a figure of merit for the test signal. As described herein, the figure of merit may be an SNR. The SNR may be determined as:

$$SNR = \frac{\text{Bin Power of Test Signal}}{\text{Bin Power of Noise Floor}}. \quad \text{Equation (4)}$$

The bin power of the test signal is the power of the bin corresponding to the test signal. The frequency of the test signal output by the controller 102 to the device under test 104 is known. Accordingly, the bin may be determined from the frequency. Further, the bin power corresponding to the test signal may be determined as the power of the bin. The bin power of the noise floor may be the sum of the power of the remaining bins (i.e., the integral of the power across all bins excluding the bin corresponding to the test signal).

The controller 102 may output the figure of merit using an output device (such as, a display). Further, the controller 102 may transmit the figure of merit externally using a communication device (such as, a modem or transceiver) to another device. The figure of merit may be evaluated by personnel who receive the figure of merit to analyze the performance of the system or the device under test 102. The output device and/or the communication device may be communicably coupled to the controller 102.

The controller 102 may determine a spectrum for any digital signal output by the device under test 104. For example, the controller 102 may determine the spectrum of a digital signal output by the device under test 104 without sending the test signal to trigger a response. The controller 102 may also perform tone detection on the frequency domain signal. For example, the controller 102 may detect a dominant frequency of the frequency domain signal by identifying a bin having maximum power. The controller 102 may exclude one or more bins corresponding to a DC component in determining the bin having maximum power.

Figure 5:
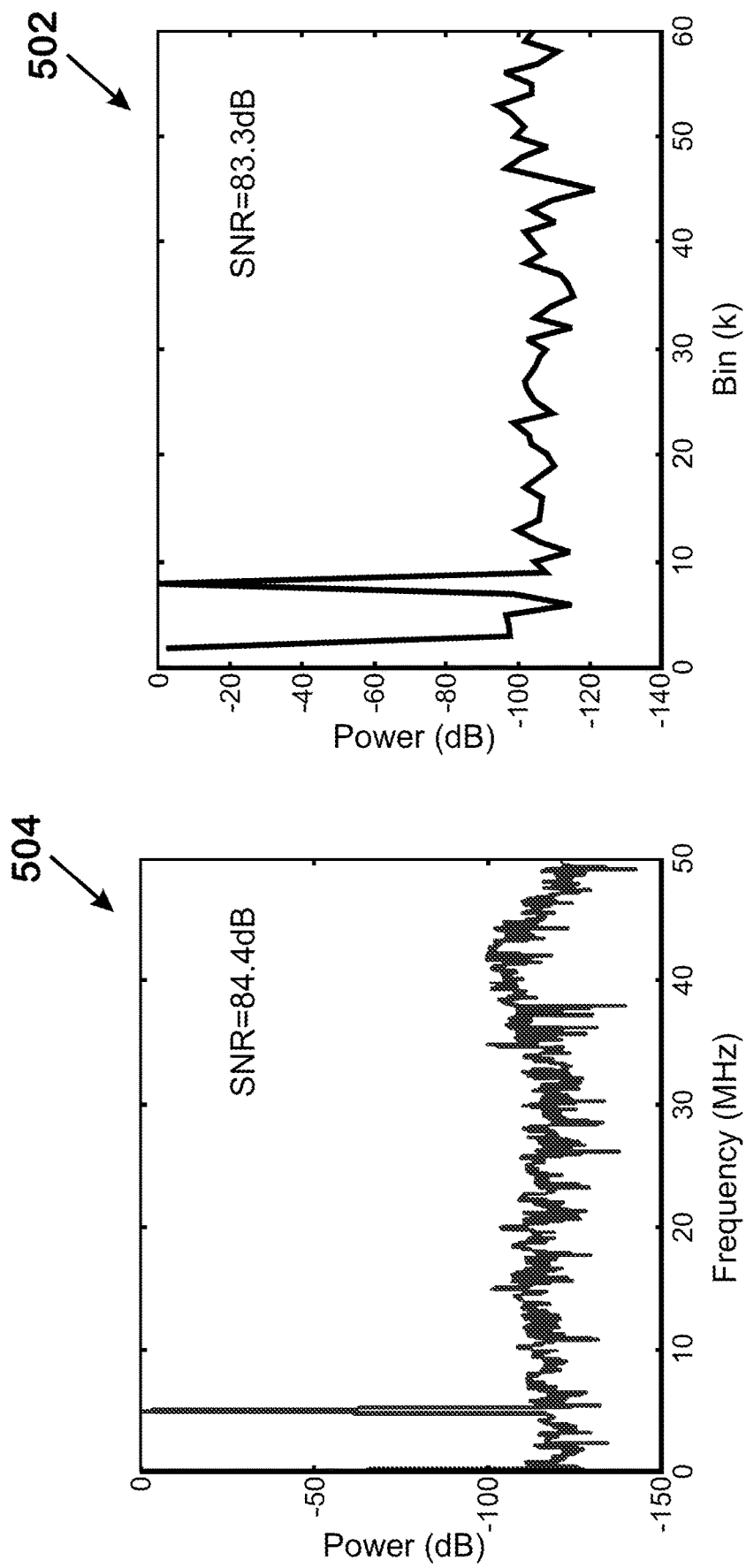
FIG. 5 shows a power diagram of the built-in self-test and a power diagram of a test performed using the test equipment.

FIG. 5 shows a power diagram 502 of the built-in self-test and a power diagram 504 of a test performed using the test equipment. The power diagram 502 of the built-in self-test and the power diagram 504 of the test equipment show peaks corresponding to the test signal and noise floors. The SNR of the built-in self-test is 83.3 dB and the SNR of the test equipment is 84.4 dB. Thus, the SNR determined by the built-in self-test corresponds to the SNR determined by the test equipment.

It is noted that testing the device under test 104 is performed in a phase-independent manner and accounts for any unpredictable phase shifts that occur in the device under test 104. Further, the testing does not require aligning the phase of the test signal and the response signal. The phase of the response signal may not be known and the phase transfer function of the device under test 104, which may be unpredictable, may also not be known. The techniques described herein may be used for performing spectral analysis and tone detection on the device under test 104.

Figure 6:
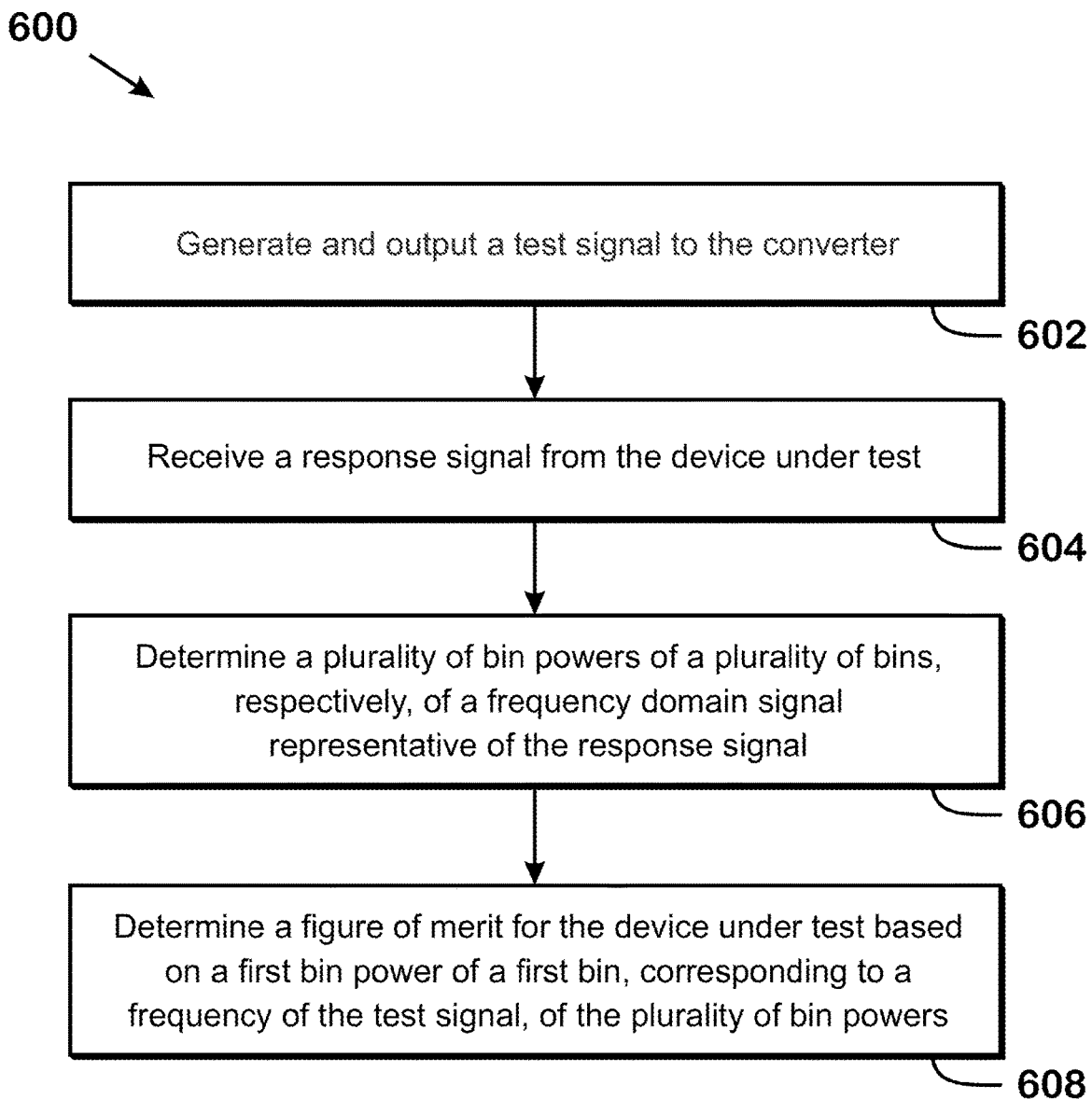
FIG. 6 shows a flow diagram of a method for testing a converter.

FIG. 6 shows a flow diagram of a method 600 for testing a converter. It is noted that although a converter is described herein, the test may be performed on a modulator or any other device. In the method 600, a controller, such as the controller 102, generates and outputs a test signal to a converter at 602. The test signal may be an analog sinusoid signal having a frequency. The controller receives a response signal from the converter at 604. The response signal may be a digital signal representative of the test signal.

At 606, the controller determines a plurality of bin powers of a plurality of bins, respectively, of a frequency domain signal representative of the response signal. The controller may determine the plurality of bin powers using a Goertzel algorithm adapted for discrete time processing. At 608, the controller determines a figure of merit for the converter based on a first bin power of a first bin of the plurality of bin powers. The first bin may correspond to the frequency of the test signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A controller, comprising:
an input configured to be coupled to a device under test; and
an output configured to be coupled to the device under test, wherein the controller is configured to:
generate a test signal;
output the test signal to the device under test;
receive a response signal from the device under test;
determine a plurality of bin powers of a plurality of bins, respectively, of a frequency domain signal representative of the response signal; and
determine a figure of merit for the device under test based on a first bin power of a first bin of the plurality of bin powers, wherein the first bin corresponds to a frequency of the test signal.

2. The controller of claim 1, wherein the controller is configured to:
output the figure of merit.

3. The controller of claim 1, wherein:
the figure of merit is a signal-to-noise ratio (SNR), and the controller is configured to:
determine the figure of merit as a ratio between the first bin power and a sum of bin powers of remaining bins, respectively, of the plurality of bin powers.

4. The controller of claim 1, wherein:
the test signal is a sinusoid, and
the controller is configured to generate the test signal by at least:
generating a modulated pulse; and
filtering the modulated pulse to generate the sinusoid.

5. The controller of claim 1, wherein the controller and the device under test are part of the same mixed-signal system and the controller tests the device under test without external control.

6. The controller of claim 1, wherein the controller is configured to:
filter the response signal; and
generate the frequency domain signal based on the filtered response signal.

7. The controller of claim 1, wherein the controller is configured to determine a bin power of the plurality of bin powers by at least:
receiving the response signal;
generating an intermediary signal based on the response signal;
squaring the intermediary signal to produce a squared intermediary signal;
squaring a time-delayed intermediary signal to produce a squared time-delayed intermediary signal;
multiplying the time-delayed intermediary signal by a factor to produce a factor-multiplied time-delayed intermediary signal; and
adding the squared intermediary signal, the squared time-delayed intermediary signal and the factor-multiplied time-delayed intermediary signal.

8. The controller of claim 7, wherein the factor is variable depending on a bin of the plurality of bins to which the bin power pertains.

9. A method, comprising:
generating, by a controller, a test signal;
outputting, by the controller, the test signal to a device under test;
receiving, by the controller, a response signal from the device under test;

determining, by the controller, a plurality of bin powers of a plurality of bins, respectively, of a frequency domain signal representative of the response signal; and determining, by the controller, a figure of merit for the device under test based on a first bin power of a first bin of the plurality of bin powers, wherein the first bin corresponds to a frequency of the test signal.

10. The method of claim 9, comprising:
outputting, by the controller, the figure of merit.

11. The method of claim 9, wherein:
the figure of merit is a signal-to-noise ratio (SNR), and the method includes:
  determining, by the controller, the figure of merit as a ratio between the first bin power and a sum of bin powers of remaining bins, respectively, of the plurality of bin powers.

12. The method of claim 9, wherein:
the test signal is a sinusoid, and
generating the test signal includes at least:
  generating a modulated pulse; and
  filtering the modulated pulse to generate the sinusoid.

13. The method of claim 9, comprising:
filtering, by the controller, the response signal; and
generating, by the controller, the frequency domain signal based on the filtered response signal.

14. The method of claim 9, wherein determining a bin power of the plurality of bin powers includes at least:
receiving, by the controller, the response signal;
generating, by the controller, an intermediary signal based on the response signal;
squaring, by the controller, the intermediary signal to produce a squared intermediary signal;
squaring, by the controller, a time-delayed intermediary signal to produce a squared time-delayed intermediary signal;
multiplying, by the controller, the time-delayed intermediary signal by a factor to produce a factor-multiplied time-delayed intermediary signal; and
adding, by the controller, the squared intermediary signal, the squared time-delayed intermediary signal and the factor-multiplied time-delayed intermediary signal.

15. A system, comprising:
a converter; and
a controller including:
  an input coupled to the converter; and
  an output coupled to the converter, wherein the controller is configured to:
    generate a test signal;
    output the test signal to the converter;
    receive a response signal from the converter;
    determine a plurality of bin powers of a plurality of bins, respectively, of a frequency domain signal representative of the response signal; and
    determine a figure of merit for the converter based on a first bin power of a first bin of the plurality of bin powers, wherein the first bin corresponds to a frequency of the test signal.

16. The system of claim 15, wherein:
the figure of merit is a signal-to-noise ratio (SNR), and the controller is configured to:
  determine the figure of merit as a ratio between the first bin power and a sum of bin powers of remaining bins, respectively, of the plurality of bin powers.

17. The system of claim 15, wherein:
the test signal is a sinusoid, and
the controller is configured to generate the test signal by at least:
  generating a modulated pulse; and
  filtering the modulated pulse to generate the sinusoid.

18. The system of claim 15, wherein the system is a mixed-signal system and the controller tests the converter without external control.

19. The system of claim 15, wherein the controller is configured to determine a bin power of the plurality of bin powers by at least:
receiving the response signal;
generating an intermediary signal based on the response signal;
squaring the intermediary signal to produce a squared intermediary signal;
squaring a time-delayed intermediary signal to produce a squared time-delayed intermediary signal;
multiplying the time-delayed intermediary signal by a factor to produce a factor-multiplied time-delayed intermediary signal; and
adding the squared intermediary signal, the squared time-delayed intermediary signal and the factor-multiplied time-delayed intermediary signal.

20. The system of claim 19, wherein the factor is variable depending on a bin of the plurality of bins to which the bin power pertains.

* * * * *